United States Patent [19]
Yamamoto et al.

[11] Patent Number: 5,514,909
[45] Date of Patent: May 7, 1996

[54] ALUMINUM ALLOY ELECTRODE FOR SEMICONDUCTOR DEVICES

[75] Inventors: Seigo Yamamoto; Katsutoshi Takagi; Eiji Iwamura; Kazuo Yoshikawa; Takashi Oonishi, all of Kobe, Japan

[73] Assignee: Kabushiki Kaisha Kobe Seiko Sho, Kobe, Japan

[21] Appl. No.: 281,028

[22] Filed: Jul. 27, 1994

[30] Foreign Application Priority Data

Jul. 27, 1993 [JP] Japan ................... 5-184747

[51] Int. Cl.$^6$ .................................. H01L 23/54
[52] U.S. Cl. ........................... 257/765; 257/771
[58] Field of Search ................... 257/765, 771

[56] References Cited

U.S. PATENT DOCUMENTS

| | | | |
|---|---|---|---|
| 4,477,793 | 10/1984 | Mukae et al. | 338/21 |
| 4,775,814 | 10/1988 | Yuhara et al. | 310/313 R |
| 4,941,032 | 7/1990 | Kobayashi et al. | 257/771 |
| 5,229,626 | 7/1993 | Ebitani et al. | 257/85 |
| 5,284,532 | 2/1994 | Skinner | 148/549 |
| 5,296,653 | 3/1994 | Kiyota et al | 174/250 |

Primary Examiner—Rolf Hille
Assistant Examiner—David B. Hardy
Attorney, Agent, or Firm—Oblon, Spivak, McClelland, Maier & Neustadt

[57] ABSTRACT

Disclosed is an electrode for semiconductor devices capable of suppressing the generation of hillocks and reducing the resistivity, which is suitable for an active matrixed liquid crystal display and the like in which a thin film transistor is used; its fabrication method; and a sputtering target for forming the electrode film for semiconductor devices. The electrode for semiconductor devices is made of an Al alloy containing the one or more alloying elements selected from Fe, Co, Ni, Ru, Rh and Ir, in a total amount from 0.1 to 10 At %, or one or more alloying elements selected from rare earth elements, in a total amount from 0.05 to 15 at %. The method of fabricating an electrode for semiconductor devices, includes the steps of: depositing an Al alloy film, in which the elements mentioned above are dissolved in an Al matrix, on a substrate; and precipitating part of all of the elements dissolved in the Al matrix as intermetallic compounds by annealing the Al alloy film at an annealing temperature ranging from 150° to 400° C.; whereby an electrode for semiconductor devices which is made of an Al alloy film with an electrical resistivity lower than 20 μΩcm is obtained. The target is made of an Al alloy containing the above elements.

11 Claims, 5 Drawing Sheets

ALUMINUM ALLOY ELECTRODE FOR SEMICONDUCTOR DEVICES

BACKGROUND OF THE INVENTION

1. Field of the Invention

The present invention relates to an electrode for semiconductor devices, its fabrication method, and a sputtering target for forming an electrode film for semiconductor devices, and particularly to an electrode for semiconductor devices which is suitable for an electrode (interconnections and electrode itself) of an active matrixed liquid crystal display having a thin film transistor, and its fabrication method.

2. Description of the Related Art

A liquid crystal display (hereinafter, referred to as "LCD") is excellent in thinning, lightening and power-saving compared with conventional displays using a cathode-ray tube, and further it is capable of obtaining a high resolution image. Furthermore, to improve the image quality, there is proposed an LCD with a thin film transistor (hereinafter, referred to as "TFT") as a switching element. Here, the TFT means an active element composed of a semiconducting film formed on an insulating substrate such as glass, to which an electrode made of a thin metal film (interconnection and electrode itself) is connected. An electrode for semiconductor devices is used as part of a TFT, and the term "electrode" as used herein is intended to refer to both interconnections and the electrode itself. In the TFT, the interconnections and the electrode are electrically connected to each other.

Various properties are required for an electrode for semiconductor devices used for the LCD mentioned above. In the tendency toward larger display size and higher resolution of LCDs, particularly, the lowering of the resistivity becomes most important for suppressing the delay of a signal. For example, in a color LCD with more than 10-inch large display, the resistivity (electrical resistance) of an electrode for semiconductor devices is required to be lower than 20 $\mu\Omega$cm.

Refractory metals such as Ta, Mo, Cr and Ti are used as the electrode materials for LCDs with TFTs (hereinafter referred to as "TFT-LCD"). However, the metals have high resistivities in the thin film state; about 180 $\mu\Omega$cm (Ta), about 50 $\mu\Omega$cm (Mo), about 50 $\mu\Omega$cm (Cr), and about 80 $\mu\Omega$cm (Ti). The resistivities of all these metals greatly exceeds the value of 20 $\mu\Omega$cm. Accordingly, to achieve a larger size and higher resolution of TFT-LCDs, there has been required a new electrode material for semiconductor devices having a low resistivity (lower than 20 $\mu\Omega$cm).

The electrode material for semiconductor devices having a low resistivity may include Au, Cu and Al. Au is difficult to etch, which property is required to form a specified pattern after deposition of the film, that is, electrode film, and it is expensive. Cu is poor in its adhesiveness to substrates and in corrosion resistance. Both metals are not practical. On the other hand, Al is insufficient in thermal stability, and has a disadvantage in generating fine protrusions called hillocks on the surface of an electrode film during a heating process after deposition of the electrode film which is inevitable for the TFT fabrication process. In general, in the TFT-LCD, the electrode film becomes the bottom layer, so that when hillocks are generated, it is impossible to deposit a film thereon.

To suppress the generation of hillocks on an Al electrode film, there has been adopted a technique wherein the heating is performed after a high strength film, such as the refractory metals, is deposited on the Al electrode film. However, in this technique, films with different etching properties must be simultaneously etched, so that it becomes difficult to obtain a good interconnection pattern. Accordingly, there has been required an electrode material for semiconductor devices used for TFT-LCDs capable of suppressing the generation of hillocks and reducing the resistivity (lower than 20 $\mu\Omega$cm).

Although the present state (prior art, problem and requirement) of an electrode for semiconductor devices of TFT-LCDs has been described, the electrode for semiconductor devices is used not only for the TFT-LCD, but also for the electrode and interconnections of an Si semiconductor represented by a Large Scale Integrated Circuit (hereinafter referred to as "LSI"). Problems in the electrode used for the LSI is the same as that of the TFT-LCD. Accordingly, there has also been required an electrode material for semiconductor devices used for LSIs capable of suppressing the generation of hillocks and reducing the resistivity (lower than 20 $\mu\Omega$cm).

SUMMARY OF THE INVENTION

A purpose of the present invention is to provide an electrode for semiconductor devices with less tendency to generate hillocks and has a resistivity lower than 20 $\mu\Omega$cm. Another purpose of the present invention is to provide a method of fabricating the electrode for semiconductor devices mentioned above and a sputtering target for forming the electrode film for semiconductor devices.

The goal mentioned above can be achieved by provision of an electrode for semiconductor devices, its fabrication method, and a sputtering target for forming an electrode film for semiconductor devices.

According to one embodiment of the invention, an electrode for semiconductor devices is made of an Al alloy containing one or more alloying elements selected from Fe, Co, Ni, Ru, Rh and Ir in a total amount from 0.1 to 10 at %. According to a second embodiment of the invention, an electrode for semiconductor devices is made of an Al alloy containing one or more alloying elements selected from rare earth elements in a total amount from 0.05 to 15 at %.

According to a third embodiment of the invention, an electrode for semiconductor devices according to the first or second embodiments of the invention is formed by a sputtering process. According to a fourth embodiment of the invention, an electrode for semiconductor devices according to the first or second embodiment of the invention is used as an electrode for semiconductor devices in a liquid crystal display. According to a fifth embodiment of the invention, in an electrode for semiconductor devices according to any of the first four embodiments, the electric resistance of the Al alloy is adjusted to be lower than 20 $\mu\Omega$cm by precipitating part or all of the alloying elements dissolved in the Al matrix as intermetallic compounds.

According to a sixth embodiment of the invention, a method of fabricating an electrode for semiconductor devices, includes the steps of: depositing an Al alloy film, in which one or more alloying elements selected from Fe, Co, Ni, Ru, Rh and Ir are dissolved in Al matrix, on a substrate; and precipitating part or all of the elements dissolved in the Al matrix as intermetallic compounds by annealing the Al alloy film at an annealing temperature ranging from 150° to 400° C.; whereby an electrode for semiconductor devices which is made of an Al alloy film having an electrical resistivity lower than 20 μΩcm is obtained. According to a seventh embodiment of the invention, a method of fabricating an electrode for semiconductor devices includes the steps of: depositing an Al alloy film, in which one or more rare earth elements are dissolved in Al matrix, on a substrate; and precipitating part or all of the elements dissolved in the Al matrix as intermetallic compounds by annealing the Al alloy film at a annealing temperature ranging from 150° to 400° C.; whereby an electrode for semiconductor devices which is made of an Al alloy film having an electrical resistivity lower than 20 μΩcm is obtained.

According to an eighth embodiment of the invention, a sputtering target for forming an electrode for semiconductor devices, which is used for depositing an Al alloy film on a substrate according to the sixth embodiment of the invention, is made of an Al alloy containing one or more alloying elements selected from Fe, Co, Ru, Rh and Ir.

According to a ninth embodiment of the invention, a sputtering target for forming an electrode for semiconductor devices, which is used for depositing an Al alloy film on a substrate according to the seventh embodiment of the invention, is made of an Al alloy containing one or more rare earth elements.

As used in this application, rare earth elements are intended to include yttrium (Y), as well as the lanthanoid elements. The lanthanoid elements contain elements from La, of atomic number 57, to Lu, of atomic number 71, in the periodic table.

DETAILED DESCRIPTION OF THE PREFERRED EMBODIMENTS

Figure 1:
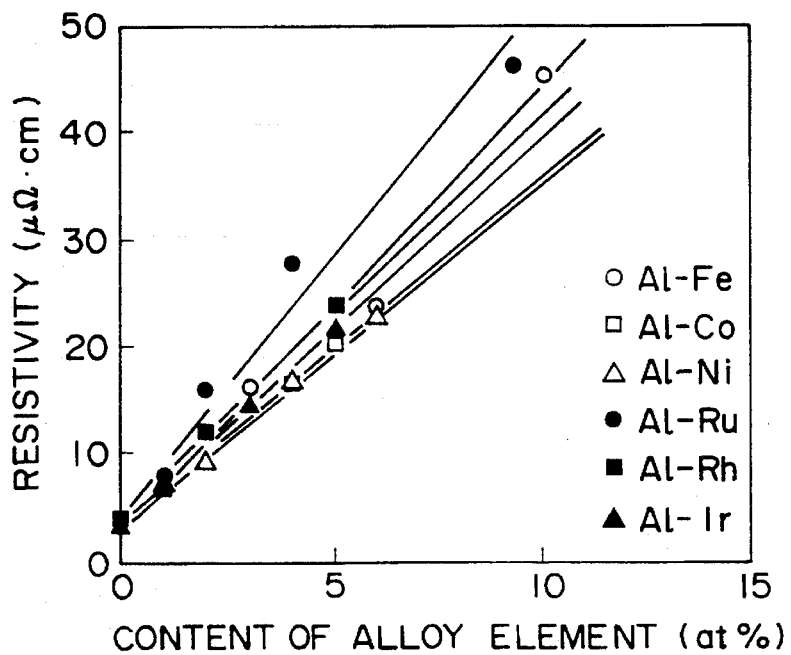
FIG. 1 shows the relationship between the content of each alloy element and the resistivity before annealing on Al alloy films for an electrode for semiconductor devices referring to the first example.

The present inventors have carried out experiments, in which an Al alloy film was deposited by sputtering using a sputtering target of an Al alloy with various added elements, and the compositions and properties as an electrode film were examined. From these experiments, the present inventors have found the following. An Al alloy film containing one or more elements selected from Fe, Co, Ni, Ru, Rh and Ir (hereinafter, referred to as "Fe, etc."), or one or more rare earth elements (hereinafter, referred to as "REM") has excellent thermal stability, and less tendency to generate hillocks during heating after deposition (that is, after formation of an electrode film), and further is reduced in resistivity after the heating process. Consequently, the above Al alloy film can satisfy the requirements of a high thermal stability (high hillock resistance) and a low resistivity, before and after the heating process (or upon heating). In particular, by positively utilizing the heating process as the heat treatment, and adjusting the annealing temperature, it becomes possible to obtain an Al alloy film satisfying the above requirements by selecting the most suitable heating condition. The present invention is the result of this knowledge.

In an Al alloy film containing Fe, etc. or REM, as the contents of Fe, etc., or REM are larger, the film is greatly reinforced by the so-called solid-solution effect of the elements and is thereby improved in thermal stability. As a result, less hillocks on such an Al film are generated during heating after deposition (after formation of electrode film). However, such an Al alloy film having improved thermal stability (high hillock resistance) is simultaneously reduced in resistivity by the so-called solid-solution effect. Namely, the Al alloy film does not satisfy the requirement of specified resistance lower than 20 μΩcm.

However, by annealing the Al alloy film, elements (Fe, etc. or REM) dissolved in an Al matrix are precipitated as intermetallic compounds, so that the total volume of the elements in solid-solution, which causes an increase in resistivity, is reduced, as a result of which the resistivity becomes lower than 20 μΩcm. Therefore, the Al alloy film containing Fe, etc, or REM can satisfy the requirements of a high thermal stability (high hillock resistance) and a low resistivity before and after the annealing, after deposition. In particular, by utilizing the annealing as the heat treatment for positively precipitating intermetallic compounds, and adjusting the total volume of the elements dissolved in the Al matrix after the heat-treatment through adjustment of the annealing temperature, the Al alloy film can satisfy each requirement by selecting the most suitable heating condition.

The contents of Fe, etc. are required to be in the range from 0.1 to 10 at %. When the contents of Fe, etc. are less than 0.1 at %, the Al alloy film is poor in thermal stability because the volume of the elements dissolved in the Al matrix is small, and it is possible to generate hillocks in the annealing. When the contents of Fe, etc. are more than 10 at %, it is difficult to satisfy the requirement of specific resistance lower than 20 μΩcm because the total volume of the elements dissolved in Al matrix is large, even by adjustment of the total volume of the elements dissolved in the Al matrix after the annealing (adjustment of the annealing temperature). In addition, when the contents of Fe, etc. are 5 at % or less, the resistivity becomes lower than 20 μΩcm by the usual heating process after deposition of an electrode film or without heating. In this regard, the content of Fe, etc. is preferably specified to be in the range from 0.1 to 5 at %. On the other hand, the contents of REM are required to be in the range from 0.05 to 15 at %. The reason for this is the same as the reason described with respect to the contents of Fe, etc. When the content of REM is less than 0.05 at %, the Al alloy film may generate hillocks; and when they are more than 15 at %, it is difficult to satisfy the requirement of resistivity lower than 20 μΩcm.

An electrode for semiconductor devices according to the present invention is made of an Al alloy containing Fe, etc. in the total amount from 0.1 to 10 at %, or REM in the total amount from 0.05 to 15 at %, and therefore, the electrode is less likely to generate hillocks and satisfies the requirement of resistivity lower than 20 μΩcm.

The electrode for semiconductor devices according to the present invention has such excellent properties, and is suitably used for an electrode for semiconductor devices in LCDs, equivalent to an Al alloy film described in the third embodiment of the invention.

An Al alloy used for an electrode for semiconductor devices according to the present invention is desirable to be deposited by sputtering. The reason for this is as follows: Namely, Fe, etc. and REM have extremely small solubility limits in Al in the equilibrium state. However, for Al alloy films deposited by sputtering, equivalent to an electrode for semiconductor devices described in the second embodiment of the invention, Fe, etc. and REM can be dissolved in solid solution by sputtering (by vapor phase rapid quenching). Accordingly, the Al alloy film can be significantly improved in properties such as thermal stability compared with the Al alloy film formed by the other method.

The Al alloy of an electrode for semiconductor devices according to the present invention is first deposited by the sputtering mentioned above or the like. At this time (that is, in the intermediate state), all or part of the alloying elements are in the solid-solution state. At the subsequent heating process or after the annealing (final state), part or all of the alloying elements in the solid-solution state are precipitated as intermetallic compounds, so that the electrical resistivity is adjusted to be lower than 20 μΩcm, equivalent to an electrode for semiconductor devices described in the fifth embodiment of the invention.

On the other hand, in a method of fabricating an electrode for semiconductor devices according to the present invention the heating process after film deposition (after formation of an electrode film) is positively utilized as the heat treatment for precipitating intermetallic compounds. Namely, an Al alloy film containing Fe, etc. or REM is deposited on a substrate in the state that alloying elements (Fe, etc. or REM) are dissolved in an Al matrix. In this case, as the volume of the elements dissolved in the Al matrix becomes larger, the Al alloy film is more reinforced by the so-called solid-solution effect and is thereby improved in thermal stability, although the resistivity become higher. After this film deposition, the heat treatment is applied to the Al alloy film. By this heat treatment, the elements dissolved in the Al matrix are precipitated as intermetallic compounds and the total volume of the elements in the solid-solution state, which causes an increase in resistivity, is reduced, as a result of which the resistivity is decreased. Thus, by positively utilizing the heating process after film deposition, the Al alloy film can satisfy the requirements of a high thermal stability and a low resistivity (the high thermal stability is a requirement during heating, and the low resistivity is a requirement after heating).

Accordingly, a method of fabricating an electrode for semiconductor devices includes the steps of: depositing an Al alloy film, in which Fe, etc. or REM are dissolved in an Al matrix, on a substrate; and precipitating part or all of the elements dissolved in the Al matrix as intermetallic compounds by annealing the Al alloy film at an annealing temperature ranging from 150° to 400° C.; whereby an electrode for semiconductor devices which is made of an Al alloy film with an electrical resistivity lower than 20 μΩcm is obtained. This method is an extremely reasonable process capable of satisfying the requirements of a high thermal stability and a low resistivity before and after the heating process (heat treatment).

Here, it may be determined whether or not all of the elements dissolved in the Al matrix should be precipitated as intermetallic compounds in accordance with the volume of the elements dissolved in the Al matrix before annealing and the desired electrical resistivity. Moreover, when it is determined that part of them should be precipitated, the precipitated amount based on the whole volume of the elements dissolved in the Al matrix is similarly determined. The annealing temperature in the heat treatment is specified to be in the range from 150° to 400° C. When it is less than 150° C., the intermetallic compounds are not precipitated, so that the Al alloy film cannot satisfy the requirement of electric resistance lower than 20 μΩcm. When it is more than 400° C., hillocks are generated during annealing.

In the deposition of the Al alloy film mentioned above by sputtering, there may be used a sputtering target made of an Al alloy containing Fe, etc. or REM. Such an Al alloy target has an advantage in stabilizing the composition of the deposited Al alloy film or reducing the oxygen amount compared with a composite target and the like.

The present invention will be more clearly understood by way of examples.

EXAMPLE 1

A binary Al alloy film with a 300 nm thickness was deposited on a glass substrate with a 0.5 mm thickness, by DC magnetron sputtering, using a composite target in which a specified number of {Fe, Co, Ni, Ru, Rh or Ir (purity: 99.9% for each element)} chips (5 mm×5 mm) were put on a pure Al target (purity: 99,999%), or a vacuum melted Al alloy target containing Fe, etc. in specified amounts. The Al alloy film is used as an interconnection of an electrode for semiconductor devices.

Figure 2:
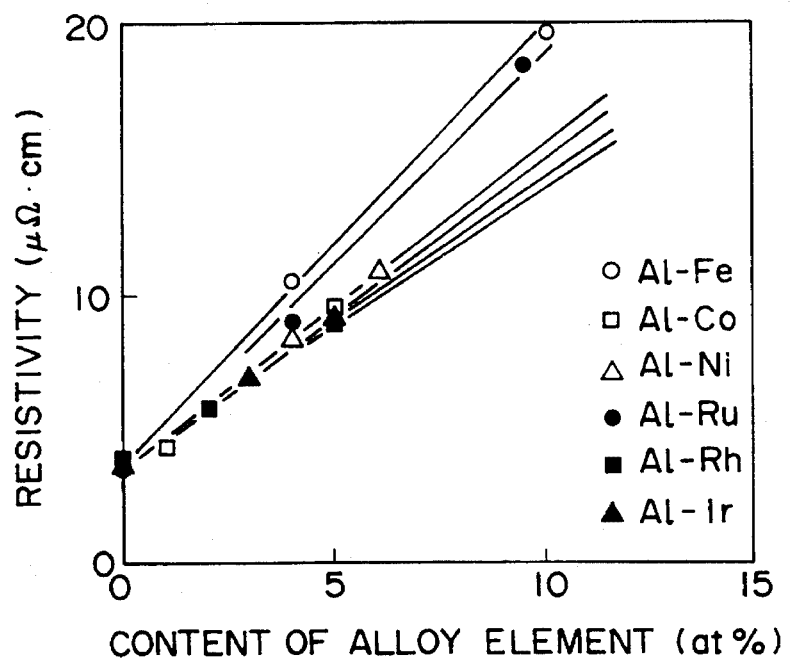
FIG. 2 shows the relationship between the content of each alloy element and the resistivity after annealing on Al alloy films for an electrode for semiconductor devices referring to the first example.
Figure 3:
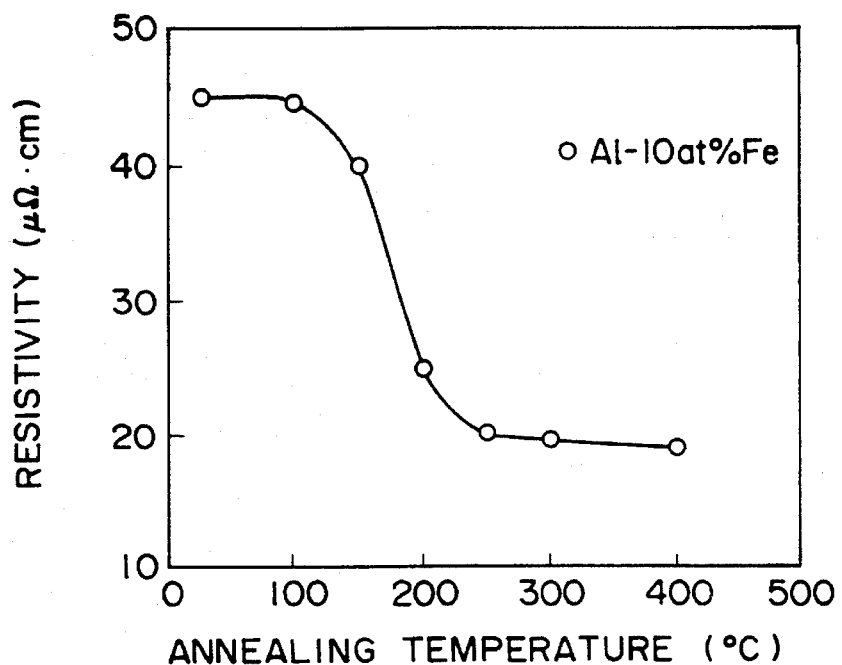
FIG. 3 shows the relationship between the annealing temperature and the resistivity on Al alloy films for an electrode for semiconductor devices referring to the second example.

The composition of the films thus obtained was analyzed by ICP, and the resistivity thereof was measured at room temperature by four-point probe method. The film was then annealed at 400° C. for 1 hr. The resistivity of the film was similarly measured. The results are summarized in the relationship between amount of Fe, etc. (hereinafter, referred to as "content of alloy element") and resistivity, which are shown in FIG. 1 (before annealing) and FIG. 2 (after annealing). The resistivity is increased linearly with increasing the content of an alloying element. However, the resistivity is decreased by the annealing at 400° C., and which is lower than 20 μΩcm even when the content of alloying element is increased up to 10 at %.

EXAMPLE 2

An Al alloy film was formed on a substrate to the same thickness as in Example 1 the same way as in Example 1, using a vacuum melted Al alloy target of Al-10at %Fe. The film was annealed at a temperature range from 100° to 500° C. for 1 hr. The resistivity of this film was measured the same way as in Example 1. The results are summarized in the relationship between the annealing temperature and the resistivity. As is apparent from this figure, the resistivity is decreased when the annealing temperature is higher than 150° C.

EXAMPLE 3

Figure 4:
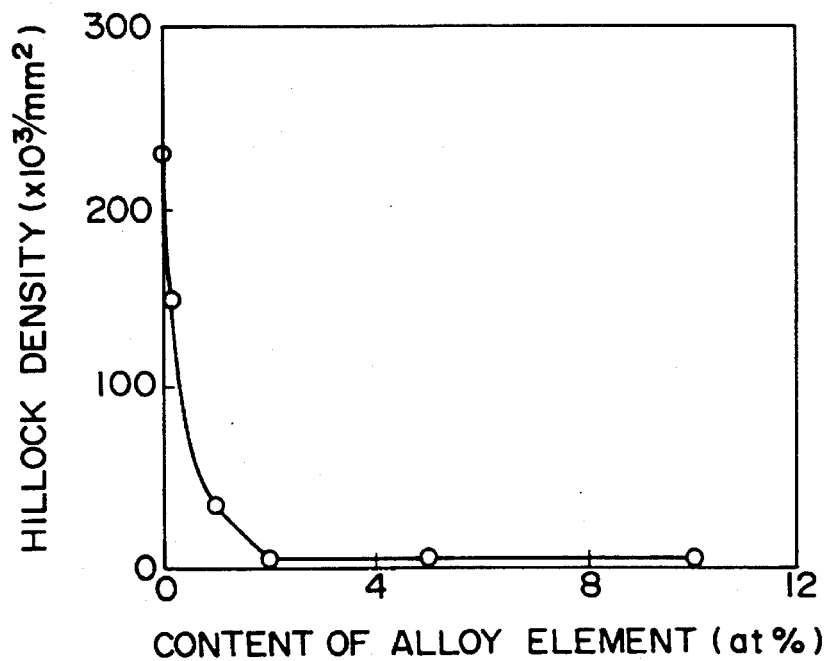
FIG. 4 shows the relationship between the content of each alloy element and the hillock density on Al alloy films for an electrode for semiconductor devices referring to the third example.

An Al alloy film containing one or more alloying elements selected from Fe, Co, Ni, Ru, Rh or Ir was formed the same way as Example 1. The film was annealed at 400° C. for 1 hr, and was observed by optical microscopy. The results are summarized in the relationship between the content of an alloying element and the hillock density, which are shown in FIG. 4. The hillock resistance is significantly improved by the addition of Fe, etc.

EXAMPLE 4

Figure 5:
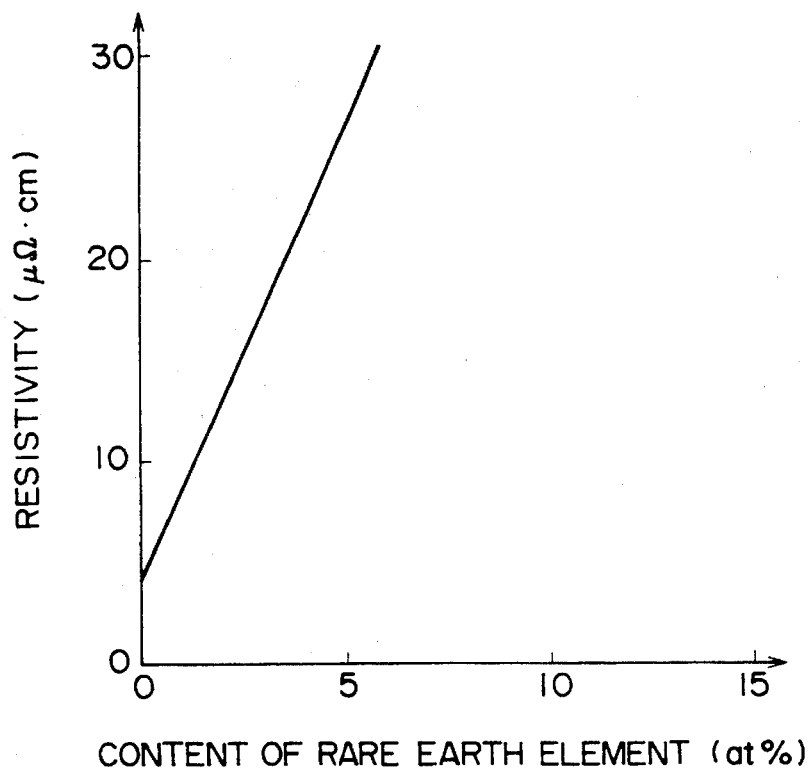
FIG. 5 shows the relationship between the content of each rare earth element and the resistivity on Al alloy films for an electrode for semiconductor devices referring to the fourth example.

A binary Al alloy film with a 300 nm thickness was deposited on a glass substrate with a 0.5 mm thickness, by DC magnetron sputtering, using a composite target in which a specified number of (rare earth elements) chips (5 mm×5 mm) were put on a pure Al target (purity: 99,999%), or a vacuum melted Al alloy target containing a rare earth element in specified amount. The composition of the film was analyzed and the resistivity thereof was measured the same way as in Example 1. The results are summarized in the relationship between the content of rare earth element in the film and the resistivity, which are shown in FIG. 5. The resistivity is increased linearly with increasing the content of the rare earth element. However, when the content of the rare earth element is 4 at % or less, the resistivity is lower than 20 μΩcm without annealing.

EXAMPLE 5

Figure 6:
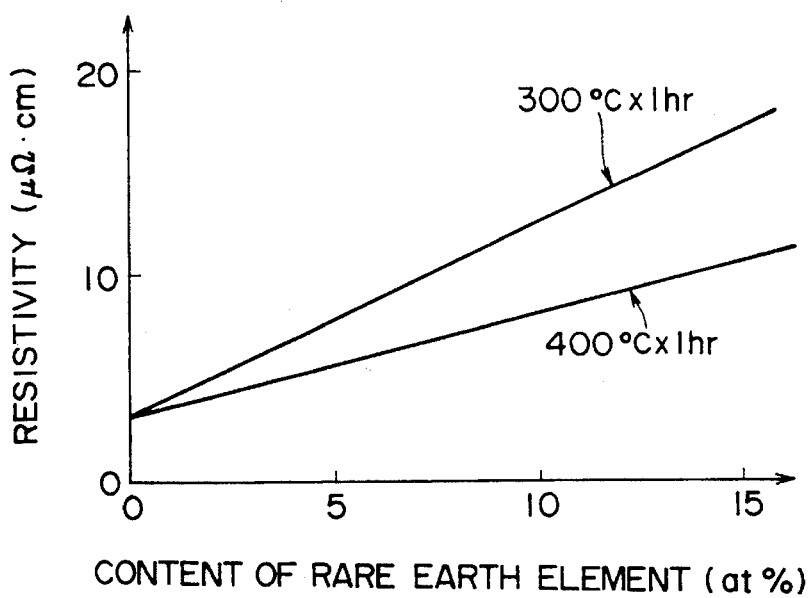
FIG. 6 shows the relationship between the content of each rare earth element and the resistivity on Al alloy films for an electrode for semiconductor devices referring to the fifth example.

Al alloy film with the same composition as in Example 4 was deposited the same way as in Example 4. The composition of the film was analyzed the same way as in Example 1. The film was then annealed at 300° or 500° C. for 1 hr. The resistivity of the film was measured the same way as in Example 1. The results are shown in FIG. 6. The resistivity is increased linearly with increasing the content of the rare earth element. The increasing rate of the resistivity is 0.1 μΩcm/at % for the film which is annealed at 300° C., and 0.5 μΩcm/at % for the film which is annealed at 500° C., each of which is significantly small. The resistivity is lower than 20 μΩcm even when the content of the rare earth element is 15 at. %

EXAMPLE 6

Figure 7:
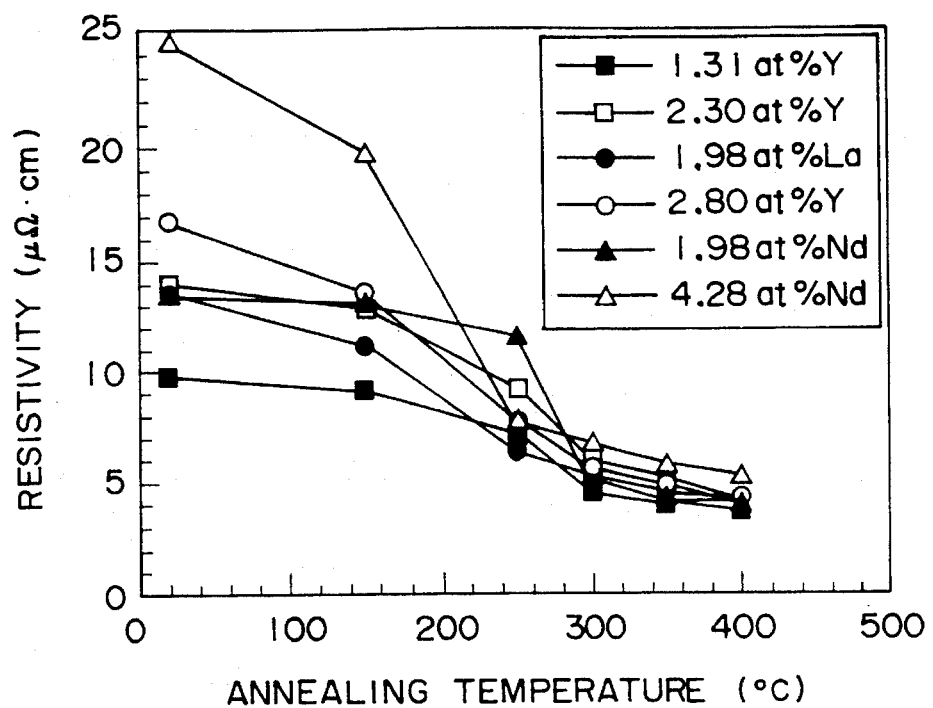
FIG. 7 shows the relationship between the annealing temperature and the resistivity on Al alloy films {alloying element: Y, La, Nd} for an electrode for semiconductor devices referring to the sixth example.
Figure 8:
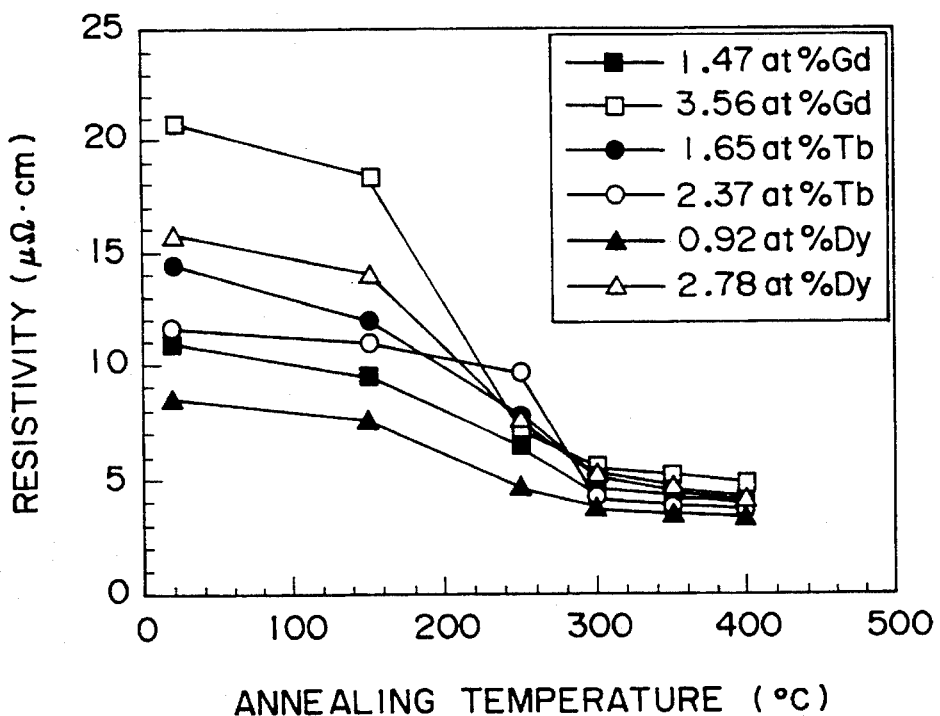
FIG. 8 shows the relationship between the annealing temperature and the resistivity on Al alloy films {alloying element: Gd, Tb, Dy} for an electrode for semiconductor devices referring to the sixth example.

Al alloy film with the same thickness as in Example 4 was deposited the same way as in Example 4, using a composite target in which a specified number of {Y, La, Nd, Gd, Tb or Dy (rare earth element)} chips (5 mm×5 mm) were put on a pure Al target (purity: 99,999%), or a vacuum melted Al alloy target containing a rare earth element in specified amount. The composition of the film was analyzed and the resistivity thereof was measured the same way as in Example 1. The film was then annealed at a temperature range from 150° to 400° C. for 1 hr. The resistivity of the film was similarly measured. The results are summarized in the relationship between the annealing temperature and the resistivity, which are shown in FIG. 7 (alloying element: Y, La, Nd), and in FIG. 8 (alloying element: Gd, Td, Dy). The resistivity is reduced by annealing at higher than 150° C. compared with that before the annealing. It is revealed that the resistivity is lower than 20 μΩcm by the annealing for both films containing a light rare earth element and heavy rare earth element.

EXAMPLE 7

Figure 9:
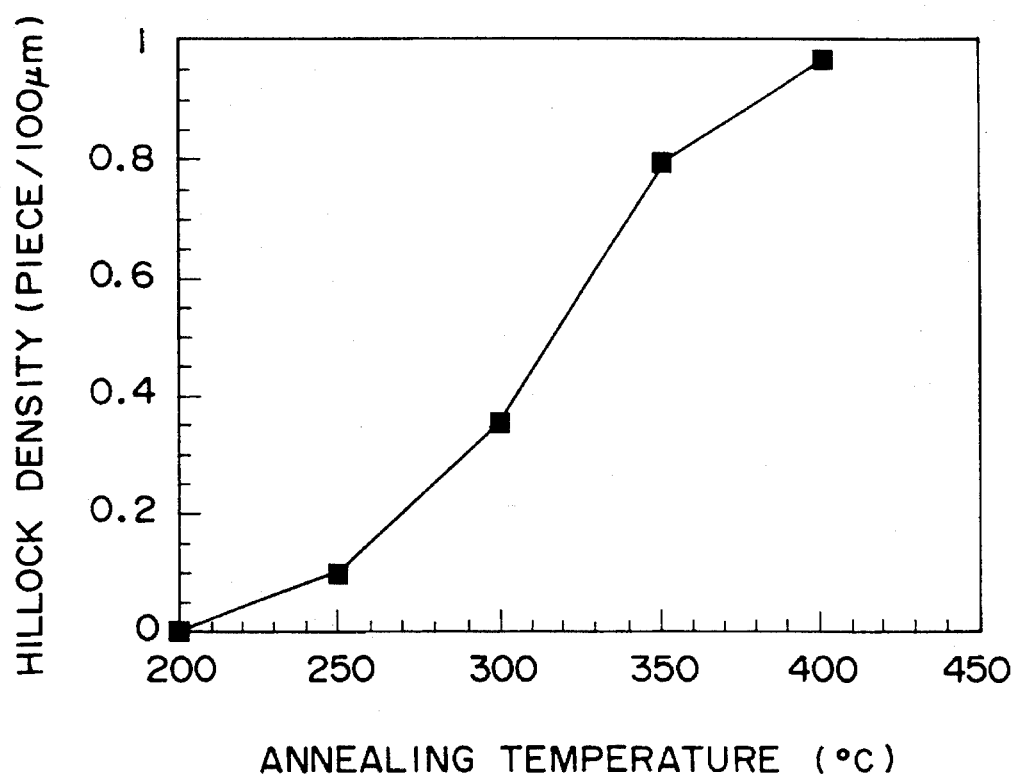
FIG. 9 shows the relationship between the annealing temperature and the hillock density on Al alloy films for an electrode for semiconductor devices referring to the seventh example.

An Al alloy film with a composition of Al-1.5at %Gd was deposited the same way as in Example 4. The films were patterned with a 10 μm wide stripe by photolithography. The film was annealed at a temperature range from 200° to 400° C. for 1 hr, and was observed by optical microscopy. The results are summarized in the relationship between the annealing temperature and the hillock density (for each length of 100 μm in a stripe pattern with a 10 μm width), which are shown in FIG. 9. The film has only one or less of the hillock density, even when being annealed at a relatively high temperature of 400° C. As a result, the film is suitable for an electrode for semiconductor devices of LCDs.

In the above-described examples, one of Fe, etc. or REM is added; however, the same effect can be obtained when two or more of Fe, etc. or REM are added.

What is claimed is:

1. An electrode for semiconductor devices which is made of an Al alloy consisting essentially of Al and at least one alloying elements selected from the group consisting of rare earth elements, in a total amount from 0.05 to 15 at %, and wherein a thin film of said alloy has an electrical resistivity of lower than 20 μΩcm.

2. An electrode for semiconductor devices according to claim 1, wherein said Al alloy is deposited by sputtering.

3. An electrode for semiconductor devices according to claim 1, wherein said electrode is used as an electrode for semiconductor devices in a liquid crystal display.

4. An electrode for semiconductor devices according to any of claim 1, wherein the electrical resistivity of the Al alloy is adjusted to be lower than 20 μΩcm by precipitating part or all of the alloying elements dissolved in the Al as intermetallic compounds.

5. The electrode of claim 1, wherein the alloying element is at least Y.

6. The electrode of claim 1, wherein the alloying element is at least La.

7. The electrode of claim 1, wherein the alloying element is at least Nd.

8. The electrode of claim 1, wherein the alloying element is at least Tb.

9. The electrode of claim 1, wherein the alloying element is at least Gd.

10. The electrode of claim 1, wherein the alloying element is at least Dy.

11. The electrode of claim 1, wherein the alloying element is at least Pr.

* * * * *